(12) United States Patent
Chuang et al.

(10) Patent No.: US 11,508,832 B2
(45) Date of Patent: *Nov. 22, 2022

(54) SEMICONDUCTOR DEVICE AND METHOD FOR FABRICATING THE SAME

(71) Applicant: UNITED MICROELECTRONICS CORP., Hsin-Chu (TW)

(72) Inventors: Fu-Jung Chuang, Kaohsiung (TW); Tsuo-Wen Lu, Kaohsiung (TW); Chia-Ming Kuo, Kaohsiung (TW); Po-Jen Chuang, Kaohsiung (TW); Chi-Mao Hsu, Tainan (TW)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 45 days.

This patent is subject to a terminal disclaimer.

(21) Appl. No.: 17/209,244

(22) Filed: Mar. 23, 2021

(65) Prior Publication Data

US 2021/0210617 A1  Jul. 8, 2021

Related U.S. Application Data

(63) Continuation of application No. 17/008,633, filed on Aug. 31, 2020, now Pat. No. 10,991,810, which is a (Continued)

(30) Foreign Application Priority Data

Jun. 5, 2019 (TW) ................................. 108119452

(51) Int. Cl.
*H01L 29/66* (2006.01)
*H01L 21/02* (2006.01)
*H01L 29/78* (2006.01)
(Continued)

(52) U.S. Cl.
CPC .... *H01L 29/6656* (2013.01); *H01L 21/02164* (2013.01); *H01L 21/02238* (2013.01);
(Continued)

(58) Field of Classification Search
CPC ......... H01L 21/02164; H01L 21/02238; H01L 21/02255; H01L 21/28141; H01L 21/31116; H01L 21/823431; H01L 21/823821; H01L 21/845; H01L 27/0886; H01L 27/0924; H01L 27/10879;
(Continued)

(56) References Cited

U.S. PATENT DOCUMENTS 7,314,793 B2 * 1/2008 Frohberg ............ H01L 29/7843
257/E21.64
8,294,186 B2 * 10/2012 Iwasaki ........... H01L 21/823412
257/E27.098

(Continued)

*Primary Examiner* — David C Spalla
(74) *Attorney, Agent, or Firm* — Winston Hsu

(57) ABSTRACT

A method for fabricating semiconductor device includes the steps of: forming a gate structure on a substrate; forming a polymer block on a corner between the gate structure and the substrate; performing a cleaning process; performing an oxidation process by injecting oxygen gas under 750° C. to form a first seal layer on sidewalls of the gate structure; and forming a source/drain region adjacent to two sides of the gate structure.

8 Claims, 3 Drawing Sheets

Related U.S. Application Data continuation of application No. 16/503,609, filed on Jul. 4, 2019, now Pat. No. 10,797,157.

(51) Int. Cl.
*H01L 21/311* (2006.01)

(52) U.S. Cl.
CPC .. *H01L 21/02255* (2013.01); *H01L 29/66545* (2013.01); *H01L 29/66795* (2013.01); *H01L 29/785* (2013.01); *H01L 21/31116* (2013.01)

(58) Field of Classification Search
CPC ............. H01L 27/1211; H01L 29/0653; H01L 29/41791; H01L 29/42392; H01L 29/6653; H01L 29/66545; H01L 29/66553; H01L 29/6656; H01L 29/66795; H01L 29/6681; H01L 29/785; H01L 29/7851; H01L 29/7853; H01L 29/7855; H01L 2029/7858
See application file for complete search history.

(56) References Cited

U.S. PATENT DOCUMENTS

| | | | |
|---|---|---|---|
| 8,404,535 B2 | 3/2013 | Yu et al. | |
| 8,502,288 B2 * | 8/2013 | Guo | H01L 29/7847 257/E21.409 |
| 9,196,699 B1 | 11/2015 | Hsu et al. | |
| 10,797,157 B1 * | 10/2020 | Chuang | H01L 21/02238 |
| 2007/0267678 A1 * | 11/2007 | Lo | H01L 29/6653 257/314 |
| 2009/0212376 A1 | 8/2009 | Adkisson | |
| 2012/0025328 A1 | 2/2012 | Luo | |
| 2013/0277686 A1 | 10/2013 | Liu | |
| 2015/0162416 A1 | 6/2015 | Chang | |
| 2016/0111543 A1 | 4/2016 | Fang | |
| 2016/0163815 A1 * | 6/2016 | Hoentschel | H01L 29/7834 438/682 |
| 2018/0047633 A1 | 2/2018 | Chang | |

* cited by examiner

SEMICONDUCTOR DEVICE AND METHOD FOR FABRICATING THE SAME

CROSS REFERENCE TO RELATED APPLICATIONS

This is a continuation application of U.S. patent application Ser. No. 17/008,633, filed on Aug. 31, 2020, which is a continuation application of U.S. patent application Ser. No. 16/503,609, filed on Jul. 4, 2019, all of which are hereby incorporated by reference in their entirety.

BACKGROUND OF THE INVENTION

1. Field of the Invention

The invention relates to a method for fabricating semiconductor device, and more particularly to a method of forming polymer block adjacent to a gate structure.

2. Description of the Prior Art

With the trend in the industry being towards scaling down the size of the metal oxide semiconductor transistors (MOS), three-dimensional or non-planar transistor technology, such as fin field effect transistor technology (FinFET) has been developed to replace planar MOS transistors. Since the three-dimensional structure of a FinFET increases the overlapping area between the gate and the fin-shaped structure of the silicon substrate, the channel region can therefore be more effectively controlled. This way, the drain-induced barrier lowering (DIBL) effect and the short channel effect are reduced. The channel region is also longer for an equivalent gate length, thus the current between the source and the drain is increased. In addition, the threshold voltage of the FinFET can be controlled by adjusting the work function of the gate.

As the semiconductor industry enters 10 nm node generation, the resistance value of metal gates plays an important role in the performance of the FinFET device. Since metal gate transistor architecture today is still insufficient in achieving desirable performance, how to improve the design of current transistor structure has become an important task in this field.

SUMMARY OF THE INVENTION

According to an embodiment of the present invention, a method for fabricating semiconductor device includes the steps of: forming a gate structure on a substrate; forming a polymer block on a corner between the gate structure and the substrate; performing a cleaning process; performing an oxidation process by injecting oxygen gas under 750° C. to form a first seal layer on sidewalls of the gate structure; and forming a source/drain region adjacent to two sides of the gate structure.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
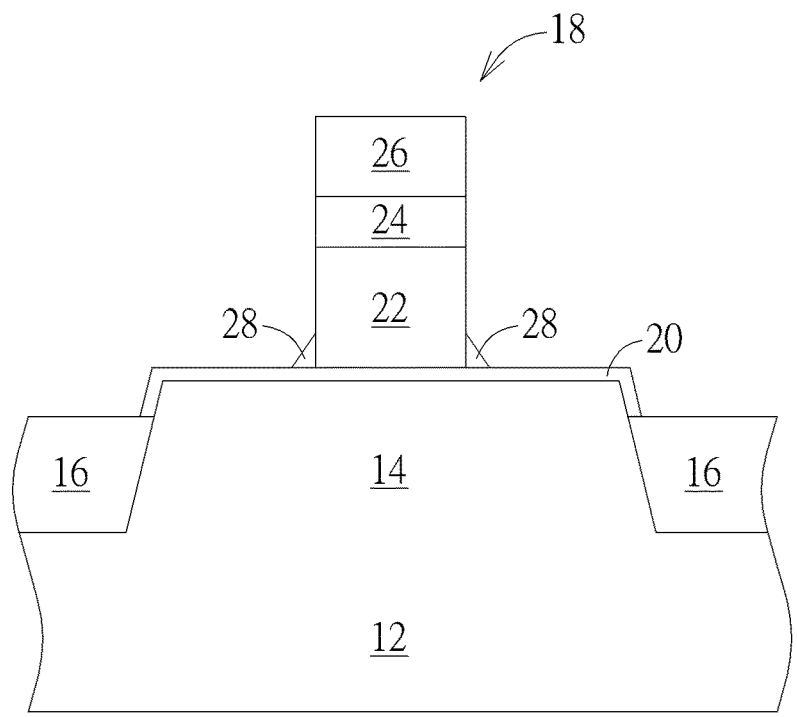
FIGS. 1-5 illustrate a method for fabricating semiconductor device according to an embodiment of the present invention.

Referring to FIGS. 1-5, FIGS. 1-5 illustrate a method for fabricating semiconductor device according to an embodiment of the present invention. As shown in FIG. 1, a substrate 12 is first provided, in which the substrate could be a silicon substrate or silicon-on-insulator (SOI) substrate. A transistor region, such as a PMOS region or a NMOS region could be defined on the substrate 12. At least a fin-shaped structure 14 and an insulating layer (not shown) are formed on the substrate 12, in which the bottom portion of the fin-shaped structure 14 is surrounded by the insulating layer preferably made of dielectric material such as silicon oxide to form a shallow trench isolation (STI) 16. It should be noted that even though this embodiment pertains to the fabrication of a non-planar FET device such as FinFET device, it would also be desirable to apply the following process to a planar FET device, which is also within the scope of the present invention.

According to an embodiment of the present invention, the fin-shaped structure 14 could be obtained by a sidewall image transfer (SIT) process. For instance, a layout pattern is first input into a computer system and is modified through suitable calculation. The modified layout is then defined in a mask and further transferred to a layer of sacrificial layer on a substrate through a photolithographic and an etching process. In this way, several sacrificial layers distributed with a same spacing and of a same width are formed on a substrate. Each of the sacrificial layers may be stripe-shaped. Subsequently, a deposition process and an etching process are carried out such that spacers are formed on the sidewalls of the patterned sacrificial layers. In a next step, sacrificial layers can be removed completely by performing an etching process. Through the etching process, the pattern defined by the spacers can be transferred into the substrate underneath, and through additional fin cut processes, desirable pattern structures, such as stripe patterned fin-shaped structures could be obtained.

Alternatively, the fin-shaped structure 14 could also be obtained by first forming a patterned mask (not shown) on the substrate, 12, and through an etching process, the pattern of the patterned mask is transferred to the substrate 12 to form the fin-shaped structure. Moreover, the formation of the fin-shaped structure could also be accomplished by first forming a patterned hard mask (not shown) on the substrate 12, and a semiconductor layer composed of silicon germanium is grown from the substrate 12 through exposed patterned hard mask via selective epitaxial growth process to form the corresponding fin-shaped structure. These approaches for forming fin-shaped structure are all within the scope of the present invention.

Next, at least a gate structure 18 or dummy gate is formed on the substrate 12. In this embodiment, the formation of the gate structure 18 could be accomplished by a gate first process, a high-k first approach from gate last process, or a high-k last approach from gate last process. Since this embodiment pertains to a high-k last approach, a gate dielectric layer or interfacial layer 20, a gate material layer 22 preferably made of polysilicon, a hard mask 24, and another hard mask 26 could be formed sequentially on the substrate 12, and a pattern transfer process is then conducted by using a patterned resist (not shown) as mask to remove part of the hard masks 26, 24, part of the gate material layer 22 and part of the gate dielectric layer through single or multiple etching processes. After stripping the patterned resist, a gate structure 18 composed of an un-patterned interfacial layer 20, a patterned gate material layer 22 or gate electrode layer, and patterned hard masks 24, 26 are formed on the substrate 12. In this embodiment, the interfacial layer 20 is preferably made of silicon oxide, the hard mask 24 is made of silicon nitride, and the hard mask 26 is made of silicon oxide.

It should be noted that hydrogen bromide (HBr) and/or nitrogen gas are preferably used as etching gas during the aforementioned patterning process to sequentially remove part of the hard masks 26, 24 and part of the gate material layer 22 for forming the gate structure 18. Preferably, at least a polymer block 28 or fin corner oxide (FCO) is formed during the etching process on sidewalls of the gate structure 18 or more specifically on a corner or corners between sidewalls of the gate structure 18 and top surface of the substrate 12 (or interfacial layer 20). In this embodiment, the composition of the polymer block 28 or FCO could vary depending on the content of the gas used during the aforementioned etching process including but not limited to for example fluorine (F), bromide (Br), and/or silicon (Si). It should also be noted that even though polymer bocks 28 are formed on corners between sidewalls of the gate structure 18 and the substrate 12 in this embodiment, according to another embodiment of the present invention, it would also be desirable to form polymer block 18 only between one sidewall of the gate structure 18 and the top surface of the substrate 12, such as on the corner between left sidewall of the gate structure 18 and top surface of the substrate 12 (or interfacial layer 20) or on the corner between right sidewall of the gate structure 18 and top surface of the substrate 12 (or interfacial layer 20), which are all within the scope of the present invention. Moreover, it would also be desirable to conduct an optional cleaning process for removing residues on the surface of the substrate 12 after the formation of the gate structure 18. Nevertheless, it should be noted that whether the cleaning process is conducted or not polymer blocks 28 are preferably formed on the corner (or corners) between sidewalls of the gate structure 18 and top surface of the substrate 12 (or interfacial layer 20) after the gate structure 18 is formed.

Figure 2:
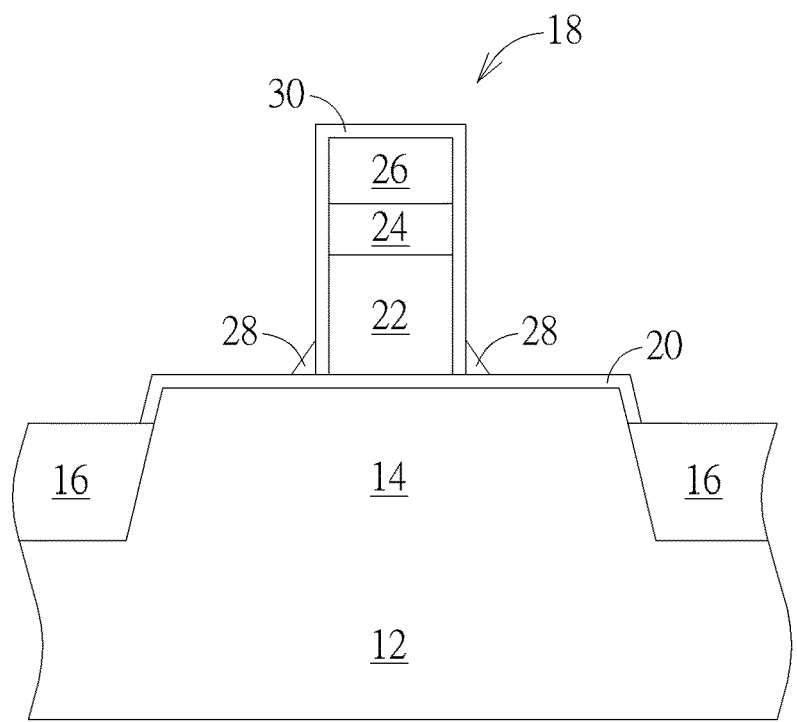

Next, as shown in FIG. 2, a re-oxidation process is conducted to form a first seal layer 30 on sidewalls of the gate structure 18. Specifically, the re-oxidation process conducted at this stage is accomplished by using furnace or dry etching approach to inject oxygen gas under approximately 750° C. to form a first seal layer 30 made of silicon oxide on top surface and sidewalls of the gate structure 18, including sidewalls of the gate material layer 22, sidewalls of the hard mask 24, and sidewalls and top surface of the hard mask 26. It should be noted that the oxygen gas applied throughout the re-oxidation process preferably penetrates or diffuses through the polymer blocks 28 to oxidize all of the sidewalls of the gate structure 18. In other words, the first seal layer 30 is preferably formed on the inner sidewalls of the polymer blocks 28 or if viewed from another perspective, the inner sidewalls of the first seal layer 30 preferably contact the gate structure 18 directly while the outer sidewalls of the first seal layer 30 contacts the inner sidewalls of the polymer blocks 28 directly.

Figure 3:
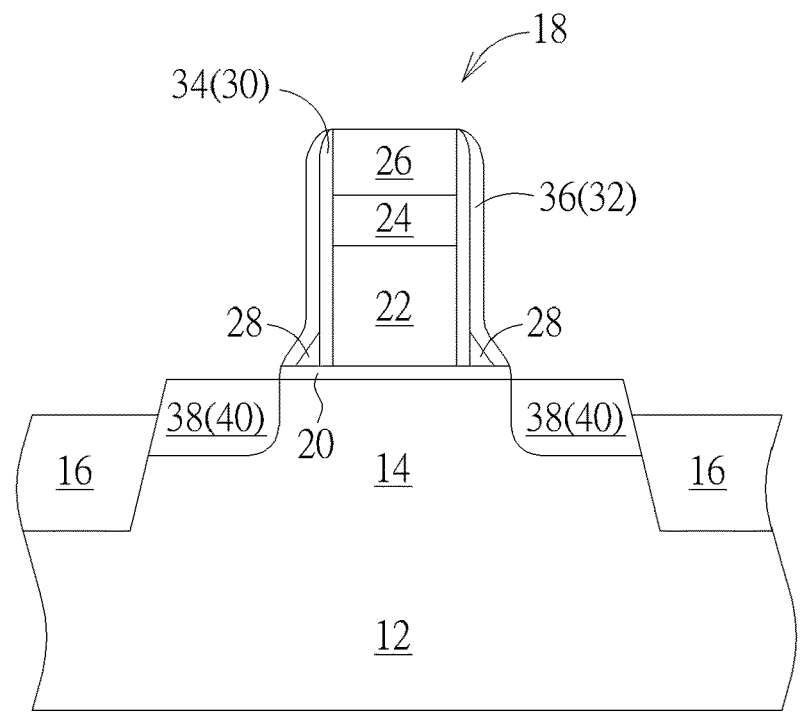

Next, as shown in FIG. 3, a second seal layer 32 is formed on sidewalls of the first seal layer 30 and the polymer blocks 28, and an etching back process is conducted to remove part of the second seal layer 32 and part of the first seal layer 30 to form a first spacer 34 and a second spacer 36 on sidewalls of the gate structure 18. In this embodiment, the first spacer 34 and the second spacer 36 are preferably made of different materials, in which the first spacer 34 is preferably made of silicon oxide while the second spacer 36 is made of silicon oxycarbonitride (SiOCN). Nevertheless, according to other embodiments of the present invention, the second spacer 36 could also be selected from the group consisting of silicon oxide, silicon nitride (SiN), silicon oxynitride (SiON), and silicon carbon nitride (SiCN).

Next, a dry etching and/or wet etching process is conducted by using the gate structure 18 and second spacer 36 as mask to remove part of the substrate 12 along the second spacer 36 to form a recess (not shown) adjacent to two sides of the gate structure 18.

Next, a selective epitaxial growth (SEG) process is conducted to form an epitaxial layer 38 in the recess. In this embodiment, a top surface of the epitaxial layer 38 is preferably even with a top surface of the substrate 12, in which the epitaxial layer 38 also shares substantially same cross-section shape with the recess. For instance, the cross-section of the epitaxial layer 38 could also a circle, a hexagon, or an octagon depending on the demand of the product. In this embodiment, the epitaxial layer 38 could also be formed to include different material depending on the type of transistor being fabricated. For instance, if the MOS transistor being fabricated were to be a PMOS transistor, the epitaxial layer 38 could be made of material including but not limited to for example SiGe, SiGeB, or SiGeSn. If the MOS transistor being fabricated were to be a NMOS transistor, the epitaxial layer 38 could be made of material including but not limited to for example SiC, SiCP, or SiP. Moreover, the SEG process could also be adjusted to form a single-layered epitaxial structure or multi-layered epitaxial structure, in which heteroatom such as germanium atom or carbon atom of the structure could be formed to have gradient while the surface of the epitaxial layer 38 is preferred to have less or no germanium atom at all to facilitate the formation of silicide afterwards. It should be noted that even though the top surfaces of the substrate 12 and epitaxial layer 38 are coplanar in this embodiment, it would also be desirable extend the epitaxial layer 38 upward so that the top surface of the epitaxial layer 38 is higher than the top surface of the substrate 12 according to another embodiment of the present invention.

Next, an ion implantation process is conducted to form a source/drain region 40 in part or the entire epitaxial layer 38. According to an embodiment of the present invention, the source/drain region 40 could also be formed insituly during the SEG process. For instance, the source/drain region 40 could be formed by implanting p-type dopants during formation of a SiGe epitaxial layer, a SiGeB epitaxial layer, or a SiGeSn epitaxial layer for PMOS transistor, or could be formed by implanting n-type dopants during formation of a SiC epitaxial layer, SiCP epitaxial layer, or SiP epitaxial layer for NMOS transistor. By doing so, it would be desirable to eliminate the need for conducting an extra ion implantation process for forming the source/drain region. Moreover, the dopants within the source/drain region 40 could also be formed with a gradient, which is also within the scope of the present invention.

Figure 4:
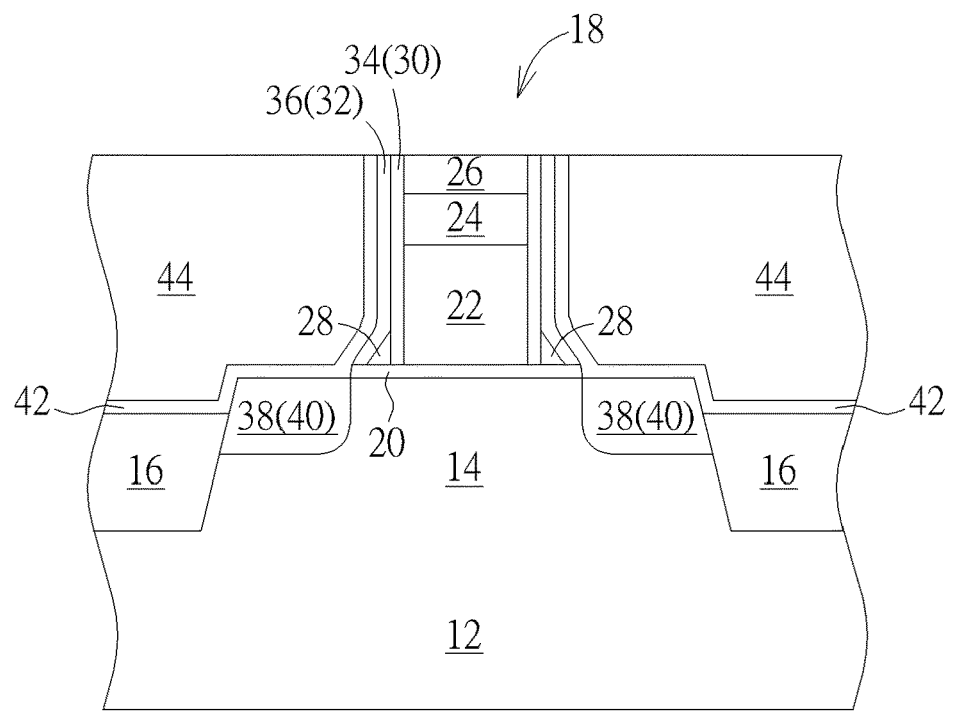

Next, as shown in FIG. 4, a contact etch stop layer (CESL) 42 is formed on the substrate 12 surface and the gate structure 18, and an interlayer dielectric (ILD) layer 44 is formed on the CESL 42 afterwards. Next, a planarizing process such as a chemical mechanical polishing (CMP) process is conducted to remove part of the ILD layer 44 and part of the CESL 42 to expose the hard mask 26 so that the top surfaces of the hard mask 26 and ILD layer 44 are coplanar. In this embodiment, the CESL 42 could include silicon nitride while the ILD layer 44 could include silicon oxide, but not limited thereto.

Figure 5:
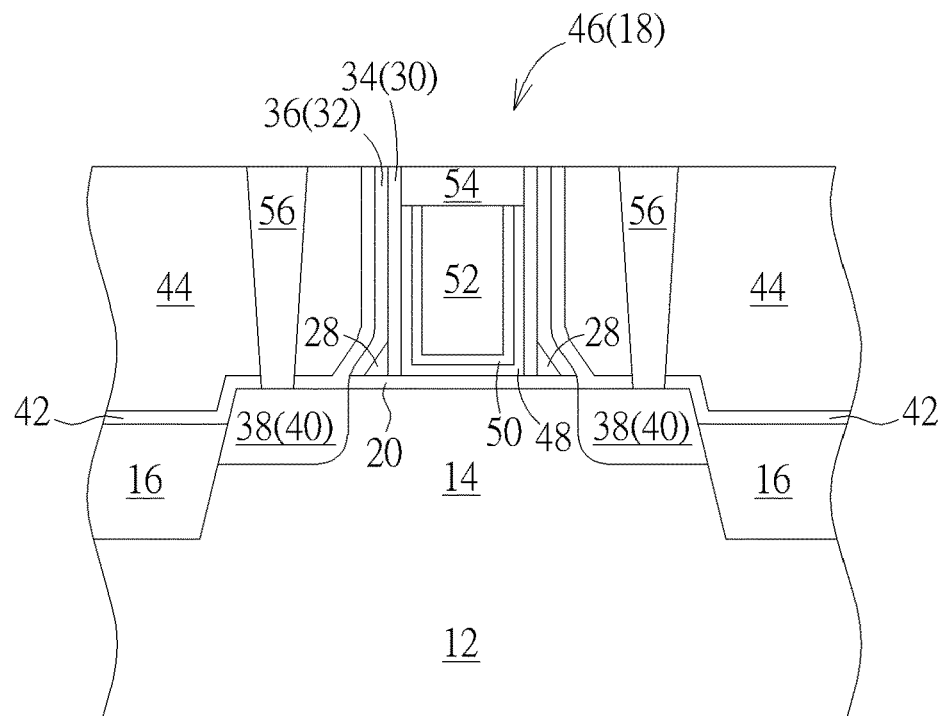

Next, as shown in FIG. 5, a replacement metal gate (RMG) process is conducted to transform the gate structure 18 into a metal gate 46. For instance, the RMG process could be accomplished by first performing a selective dry etching or wet etching process using etchants including but not limited to for example ammonium hydroxide (NH$_4$OH) or tetramethylammonium hydroxide (TMAH) to remove the hard masks 24, 26 and gate material layer 22 for forming a recess (not shown) in the ILD layer 44. Next, a high-k dielectric layer 48, a work function metal layer 50, and a low resistance metal layer 52 are formed in the recess, and a planarizing process such as CMP is conducted to remove part of low resistance metal layer 52, part of work function metal layer 50, and part of high-k dielectric layer 48 to form metal gate 46. In this embodiment, the gate structure or metal gate 46 fabricated through high-k last process of a gate last process preferably includes an interfacial layer 20 or gate dielectric layer, a U-shaped high-k dielectric layer 48, a U-shaped work function metal layer 50, and a low resistance metal layer 52. Next, part of the low resistance metal layer 52, part of the work function metal layer 50, and part of the high-k dielectric layer 48 are removed to form a recess, a hard mask 54 is formed in the recess, and a planarizing process such as CMP is conducted to remove part of the hard mask 54 so that the top surfaces of the hard mask 54 and ILD layer 44 are coplanar.

In this embodiment, the high-k dielectric layer 48 is preferably selected from dielectric materials having dielectric constant (k value) larger than 4. For instance, the high-k dielectric layer 48 may be selected from hafnium oxide (HfO$_2$), hafnium silicon oxide (HfSiO$_4$), hafnium silicon oxynitride (HfSiON), aluminum oxide (Al$_2$O$_3$), lanthanum oxide (La$_2$O$_3$), tantalum oxide (Ta$_2$O$_5$), yttrium oxide (Y$_2$O$_3$), zirconium oxide (ZrO$_2$), strontium titanate oxide (SrTiO$_3$), zirconium silicon oxide (ZrSiO$_4$), hafnium zirconium oxide (HfZrO$_4$), strontium bismuth tantalate (SrBi$_2$Ta$_2$O$_9$, SBT), lead zirconate titanate (PbZr$_x$Ti$_{1-x}$O$_3$, PZT), barium strontium titanate (Ba$_x$Sr$_{1-x}$TiO$_3$, BST) or a combination thereof.

In this embodiment, the work function metal layer 50 is formed for tuning the work function of the metal gate in accordance with the conductivity of the device. For an NMOS transistor, the work function metal layer 50 having a work function ranging between 3.9 eV and 4.3 eV may include titanium aluminide (TiAl), zirconium aluminide (ZrAl), tungsten aluminide (WAl), tantalum aluminide (TaAl), hafnium aluminide (HfAl), or titanium aluminum carbide (TiAlC), but it is not limited thereto. For a PMOS transistor, the work function metal layer 50 having a work function ranging between 4.8 eV and 5.2 eV may include titanium nitride (TiN), tantalum nitride (TaN), tantalum carbide (TaC), but it is not limited thereto. An optional barrier layer (not shown) could be formed between the work function metal layer 50 and the low resistance metal layer 52, in which the material of the barrier layer may include titanium (Ti), titanium nitride (TiN), tantalum (Ta) or tantalum nitride (TaN). Furthermore, the material of the low-resistance metal layer 52 may include copper (Cu), aluminum (Al), titanium aluminum (TiAl), cobalt tungsten phosphide (CoWP) or any combination thereof. Next, a contact plug formation could be conducted by forming contact plugs 56 in the ILD layer 44 and CESL 42 to electrically connect the source/drain region 40 adjacent to two sides of the second spacer 36. This completes the fabrication of a semiconductor device according to an embodiment of the present invention.

Referring again to FIG. 5, which further illustrates a structural view of a semiconductor device according to an embodiment of the present invention. As shown in FIG. 5, the semiconductor device preferably includes a gate structure 18 disposed on the substrate 12, a first spacer 34 disposed on sidewalls of the gate structure 18, a second spacer 36 disposed on sidewalls of the first spacer 34, polymer blocks 28 disposed between the first spacer 34 and the second spacer 36 and also on corners between the gate structure 18 and the substrate 12, and a source/drain region 40 adjacent to two sides of the gate structure 18.

Overall, each of the polymer blocks 28 is surrounded by the first spacer 34, the interfacial layer 20, and the second spacer 36. It should be noted that even though each of the polymer blocks 28 includes a triangular cross-section in this embodiment, according to other embodiment of the present invention, the shape of polymer blocks 28 could also vary depending on the gas used during the aforementioned etching process. For instance, each of the polymer blocks 28 could include circular, rectangular square, or other irregular shapes. Preferably, the overall height of each of the polymer blocks 28 is less than ⅟₁₀ or even ⅟₂₀ of the entire height of the gate structure 18.

In this embodiment, the first spacer 34 and the polymer blocks 28 are preferably made of different materials and the second spacer 36 and the polymer blocks 28 are made of different materials, in which the first spacer 34 preferably includes silicon oxide, the second spacer 36 includes SiOCN, and the composition of the polymer block 28 could vary depending on the content of the gas used during the aforementioned etching process. According to an embodiment of the present invention, the polymer block 28 could include elements including but not limited to for example fluorine (F), bromide (Br), and/or silicon (Si).

Figure 6:
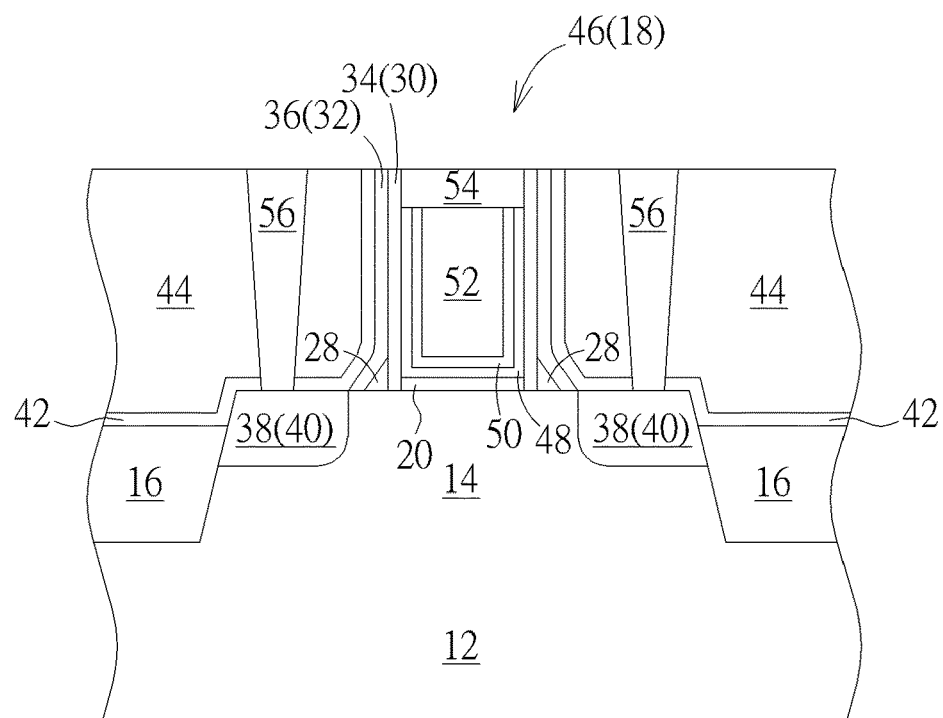
FIG. 6 illustrates a structural view of a semiconductor device according to an embodiment of the present invention.

Referring to FIG. 6, FIG. 6 illustrates a structural view of a semiconductor device according to an embodiment of the present invention. As shown in FIG. 6, in contrast to not removing any of the interfacial layer 20 on the surface of the substrate 12 while using etching process to remove part of the hard masks 24, 26, and the gate material layer 22, it would also be desirable to remove a part of the interfacial layer 20 as the hard masks 24, 26 and the gate material layer 22 are patterned to form gate structure 18 so that no interfacial layer 20 remains on the surface of the fin-shaped structure 14 adjacent to two sides of the gate structure 18. Next, processes in FIGS. 2-5 are conducted to form polymer blocks 28, first spacer 34, and second spacer 36 on sidewalls of the gate structure 18, form a CESL 42 and ILD layer 44 on the gate structure 18, and performing a RMG process to transform polysilicon gate structure 18 into metal gate 46. Structurally, since no interfacial layer 20 remains on the surface of the substrate 12 adjacent to two sides of the gate structure 18 or directly under the polymer blocks 28 so that the polymer blocks 28 contact the substrate 12 directly, each of the polymer blocks 28 is surrounded by the first spacer 34, the substrate 12, and the second spacer 36 instead of being surrounded by the first spacer 34, the interfacial layer 20, and the second spacer 36 in the aforementioned embodiment.

In current FinFET process, polymer blocks or fin corner oxide (FCO) residues are often formed on corners between gate structure and the substrate during formation of the gate structure, and the polymer blocks are then sealed between gate electrode and the spacer formed afterwards. Since the polymer blocks in current process are typically sealed immediately adjacent to or directly contacting the gate material layer or gate electrode made of polysilicon, the polymer blocks are often removed along with the polysilicon gate material layer during the RMG process and results in severe leakage. To resolve this issue, the present invention preferably conducts an oxidation process to form a first seal layer 30 or first spacer 34 between sidewalls of the gate structure and inner sidewall of the polymer block after the polymer blocks are formed on corners between gate structure and the substrate. By using the first spacer 34 as a barrier structure between the polymer blocks and the gate structure, it would be desirable to prevent leakage when gate material layer made of polysilicon is removed during RMG process.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method for fabricating semiconductor device, comprising:
    forming a gate structure on a substrate;
    forming a polymer block on a corner between the gate structure and the substrate;
    performing a cleaning process;
    performing an oxidation process by injecting oxygen gas under 750° C. to form a first seal layer on sidewalls of the gate structure; and
    forming a source/drain region adjacent to two sides of the gate structure.

2. The method of claim 1, further comprising forming the polymer block on a corner between sidewalls of the gate structure a top surface of the substrate.

3. The method of claim 1, further comprising performing the oxidation process to oxidize sidewalls of the gate structure to form the first seal layer.

4. The method of claim 1, further comprising forming the first seal layer on sidewalls of the gate structure and an inner sidewall of the polymer block.

5. The method of claim 1, further comprising:
    forming a gate material layer on the substrate;
    forming a first hard mask on the gate material layer;
    forming a second hard mask on the first hard mask; and
    patterning the second hard mask, the first hard mask, and the gate material layer to form the gate structure and forming the polymer block.

6. The method of claim 1, further comprising:
    forming a second seal layer on sidewalls of the first seal layer and the polymer block;
    removing the second seal layer and the first seal layer to form a first spacer and a second spacer;
    forming the source/drain region adjacent to two sides of the second spacer;
    forming an interlayer-dielectric (ILD) layer on the gate structure; and
    performing a replacement metal gate (RMG) process to transform the gate structure into a metal gate.

7. The method of claim 6, wherein sidewalls of the polymer block contact the first spacer and the second spacer.

8. The method of claim 1, wherein the polymer block comprises silicon.

* * * * *